US010672655B2

(12) United States Patent
Briggs et al.

(10) Patent No.: US 10,672,655 B2
(45) Date of Patent: Jun. 2, 2020

(54) METHOD OF PATTERNING TARGET LAYER

(71) Applicants: IMEC VZW, Leuven (BE); Katholieke Universiteit Leuven, Leuven (BE)

(72) Inventors: Basoene Briggs, Heverlee (BE); Ivan Zyulkov, Leuven (BE); Katia Devriendt, Binkom (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 184 days.

(21) Appl. No.: 15/975,611

(22) Filed: May 9, 2018

(65) Prior Publication Data

US 2018/0330986 A1 Nov. 15, 2018

(30) Foreign Application Priority Data

May 10, 2017 (EP) ..................................... 17170339

(51) Int. Cl.
*H01L 21/027* (2006.01)
*H01L 21/768* (2006.01)
(Continued)

(52) U.S. Cl.
CPC .... *H01L 21/76879* (2013.01); *H01L 21/0337* (2013.01); *H01L 21/288* (2013.01);
(Continued)

(58) Field of Classification Search
CPC ......................... H01L 21/027; H01L 21/76877
See application file for complete search history.

(56) References Cited

U.S. PATENT DOCUMENTS 9,105,699 B2 8/2015 Farys
9,202,744 B1 * 12/2015 Ban .................. H01L 21/76808
(Continued)

FOREIGN PATENT DOCUMENTS

WO WO 2015/047318 A1 4/2015

OTHER PUBLICATIONS

European Search Report for European Patent Office Application No. 17170339.0-1555 dated Nov. 14, 2017; 5 pages.

*Primary Examiner* — Errol V Fernandes
(74) *Attorney, Agent, or Firm* — Knobbe, Martens Olson & Bear LLP

(57) ABSTRACT

The disclosed technology generally relates to patterning structures in semiconductor fabrication, and more particularly to patterning structures using mask structures having bridged lines. In one aspect, a method for patterning a target layer comprises: forming on the target layer a plurality of parallel material lines spaced apart such that longitudinal gaps exposing the target layer are formed between the material lines, filling the gaps with a sacrificial material, forming a hole by removing the sacrificial material along a portion of one of the gaps, the hole extending across the gap and exposing a surface portion of the target layer and sidewall surface portions of material lines on opposite sides of the one gap, performing a selective deposition process adapted to grow a fill material selectively on the one or more surface portions inside the hole, thereby forming a block mask extending across the gap, removing, selectively to the material lines and the block mask, the sacrificial material from the target layer to expose the gaps, the one gap being interrupted in the longitudinal direction by the block mask, and transferring a pattern including the material lines and the block mask into the target layer.

19 Claims, 7 Drawing Sheets

(51) Int. Cl.
  *H01L 21/311* (2006.01)
  *H01L 21/033* (2006.01)
  *H01L 21/288* (2006.01)
  *H01L 21/285* (2006.01)

(52) U.S. Cl.
  CPC .. *H01L 21/28562* (2013.01); *H01L 21/31111* (2013.01); *H01L 21/76816* (2013.01); *H01L 21/76873* (2013.01)

(56) References Cited

U.S. PATENT DOCUMENTS

| | | | |
|---|---|---|---|
| 9,368,395 B1* | 6/2016 | Wei | H01L 21/76805 |
| 10,002,786 B1* | 6/2018 | Licausi | H01L 23/53242 |
| 2013/0187222 A1 | 7/2013 | Park | |
| 2015/0349109 A1* | 12/2015 | Lee | H01L 23/5226 |
| | | | 257/314 |
| 2016/0042950 A1 | 2/2016 | Dai et al. | |

* cited by examiner

METHOD OF PATTERNING TARGET LAYER

CROSS-REFERENCE TO RELATED APPLICATIONS

This application claims foreign priority to European Patent Application EP 17170339.0, filed May 10, 2017, the content of which is incorporated by reference herein in its entirety.

BACKGROUND

Field

The disclosed technology generally relates to patterning structures in semiconductor fabrication, and more particularly to patterning structures using mask structures having bridged lines.

Description of the Related Technology

In various contexts of modern integrated circuit (IC) device fabrication, patterns such as lines or trenches are formed in a layer. The patterns can be formed sacrificial, such as patterns formed using a hard mask layer, or permanent, such as patterns formed using a target layer. For instance, such methods may be used to enable forming of electrical interconnection structures for interconnecting semiconductor devices in a functioning circuit.

An interconnection structure may include one or more metallization levels or tiers, which may be formed above the substrate, e.g., above semiconductor devices formed in the substrate, such as transistors. As generally understood in the industry, a metallization level includes conductive paths or lines arranged in a dielectric material layer. The metallization level may also include contacts or vias electrically contacting the conductive paths to electrically connect the conductive paths to other parts of the IC device, e.g., conductive paths of another metallization level and/or the semiconductor devices formed in the substrate. A metallization level may be formed by forming a pattern of conductive lines in the dielectric layer. A mask layer arranged on the dielectric layer may be patterned using lithographic techniques and etching. The pattern of the mask layer may subsequently be transferred into the dielectric layer by etching. Multiple patterning techniques like (litho-etch)$^x$, or pitch splitting techniques such as self-aligned double patterning (SADP) or quadruple patterning (SAQP), may be used to enable patterns with sub-lithographic critical dimensions.

Some conductive paths include interrupted, bridged or discontinuous lines. Prior art techniques such as direct printing, or block techniques, may however be challenging to further down-scale, e.g., to form interrupted, bridged or discontinuous lines, which may have sub-lithographic features, or may involve complex process sequences and/or etching or lithography layer stacks.

SUMMARY OF CERTAIN INVENTIVE ASPECTS

An objective of the present inventive concept is to provide an improved method for patterning a target layer. Further and alternative objectives may be understood from the following.

According to an aspect of the present disclosed technology there is provided a method for patterning a target layer, the method comprising:

forming on the target layer a plurality of parallel material lines spaced apart such that longitudinal gaps exposing the target layer are formed between the material lines, filling the gaps with a sacrificial material, forming a hole by removing the sacrificial material along a portion of one of the gaps, the hole extending across the gap and exposing a surface portion of the target layer and sidewall surface portions of material lines on opposite sides of the one gap, performing a selective deposition process adapted to grow a fill material selectively on the one or more surface portions inside the hole, thereby forming a block mask extending across the gap, removing, selectively to the material lines and the block mask, the sacrificial material from the target layer to expose the gaps, the one gap being interrupted in the longitudinal direction by the block mask, and transferring a pattern including the material lines and the block mask into the target layer.

By the inventive method, the target layer may be patterned to include trenches, at least one of which is interrupted to form a discontinuous trench.

The trench interruption is enabled by the block mask which may be formed without requiring any complex material stack for material deposition or complexing etching sequence. Rather the block mask may be selectively grown in the hole, between selected pairs of adjacent material lines. A discrete block mask may hence be formed in the hole.

The present method may be advantageously applied for the purpose of forming trenches for conductive lines in a dielectric layer. The target layer may accordingly form a mask layer arranged on a dielectric layer (in which the conductive lines are to be formed).

By the hole extending across the gap, the hole exposes sidewall surfaces of material lines on opposite sides of the gap. More specifically, the hole may expose a sidewall surface of a first material line and a sidewall surface of a second material line, the first and second material lines being arranged on opposite sides of the gap. The block mask may hence conveniently and reliably be formed to fully bridge the gap by growing fill material in the hole.

Since the block mask is selectively grown inside the hole, the block mask may be formed within an intended gap even if the hole is formed to overlap the material lines on opposite sides of the intended gap. This allows a degree of relaxation of the alignment requirements of the hole with respect to the material lines and the gap.

By "patterning" of a target layer is hereby meant the definition of a pattern above the target layer, and a transfer of the pattern into the target layer.

The transfer of the pattern into the target layer may include etching the target layer using the material lines and the block mask as an etch mask.

By a second feature such as a layer, a level or other element, being formed "on" a first feature such as a layer, a level or other element, is hereby meant that the second feature is formed directly on the first feature, i.e. in abutment with the first feature, or with one or more layers intermediate the second and the first feature, i.e. not in direct contact with the first feature.

By a second feature such as a layer, a level or other element, being formed "above" a first feature such as a layer, a level or other element, is hereby meant that the second feature is formed above the first feature along (or as seen) in a stacking direction of the features forming part of the overall structure. This direction may equivalently be defined as a normal direction to (a main surface of) the target layer, or a normal direction to a substrate supporting the features or layers. The stacking direction may also be referred to as a "vertical" direction. A "horizontal" direction may be used to refer to a direction parallel to a main plane of extension, or a main surface, of the target layer or of the substrate.

By "metallization level" is hereby meant a structure including conductive paths arranged in a dielectric layer. The conductive paths may include conductive lines extending in a horizontal direction in the dielectric layer. The conductive paths may include conductive vias extending vertically through the dielectric layer.

By a "trench" in a layer (e.g. in the target layer or in the dielectric layer) is hereby meant a recess in the layer. Advantageously, a trench may, at least along a portion thereof, extend in a straight line and presents a uniform width or substantially uniform width.

The material lines may be formed as a set or parallel and regularly spaced material lines. The gaps may present a regular width and spacing. The material lines may also be referred to as cores or mandrels.

By a selective deposition process adapted to grow the fill material selectively on the one or more surface portions inside the hole is hereby meant any deposition process which results in a selective growth or selective deposition of the fill material on the one or more surface portions but no, or substantially no, growth or deposition of the fill material on other surface portions, in particular surface portions of the sacrificial material.

The deposition process may be adapted to grow the fill material on the one or more surface portions inside the hole to at least partially fill the hole. The fill material may also be grown to completely fill, or even overflow, the hole.

According to one embodiment the method further comprises, prior to performing the deposition process, performing a treatment process adapted to functionalize, with respect to the deposition process, one or more of the surface portions inside the hole, Thereby, the surface portions in the hole, namely the exposed surface portion of the target layer and the exposed sidewall surface portions of material lines, may be made more reactive with respect to the deposition process and hence improve the selectivity of the deposition on the surfaces.

By a treatment process adapted to functionalize a surface portion with respect to a subsequent deposition process is hereby meant any treatment process which causes the surface portion to become increasingly reactive with respect to the deposition process. The surface portions may thus be provided with an increased tendency to react with one or more precursors of the deposition process. Thereby, nucleation of the fill material on the functionalized surface portions may be promoted. Various advantageous embodiments of treatment processes will be described below.

According to one embodiment the treatment process is further or alternatively adapted to passivate exposed surface portions of the sacrificial material with respect to the deposition process. Thereby, the exposed surface portions of the sacrificial material may be made inert, or substantially inert, with respect to the deposition process. The exposed surface portions of the sacrificial material may thus be provided with a reduced tendency to react with one or more precursors of the deposition process. Thereby, nucleation of the fill material on the exposed surface portions of the sacrificial material may be counteracted.

The exposed surface portions of the sacrificial material may include upper surface portions of the sacrificial material. The exposed surface portions of the sacrificial material may include sidewall surface portions of the sacrificial material exposed inside the hole.

The treatment process may include an etching step. An etching step provides a comparably simple and easily controllable manner of functionalizing surface portions inside the hole, and optionally to also passivate exposed surface portions of the sacrificial material. By an etching step, coatings or thin films formed on a surface portion of the target layer exposed in the hole and sidewall surface portions of material lines exposed in the hole, which coatings or films otherwise could reduce the reactivity of the surface portions with respect to the deposition process, may be removed. Simultaneously, an etching step may promote formation of coatings thin films on exposed surface portions of the sacrificial material, which coatings or films reduces the reactivity of exposed surface portions of the sacrificial material with respect to the deposition process.

In an advantageous embodiment the sacrificial material may be an oxide material and at least one of (advantageously both) the material lines and the target layer may be formed by a non-oxide material, and wherein the treatment process includes an oxide etch step. By the oxide etch step oxide formed on one or more of the surface portions inside the hole may be removed. Oxides, which may reduce the reactivity of the surface portions of the target layer and material lines exposed in the hole, may thereby be removed. Since the sacrificial material is of an oxide material, the inert properties of the sacrificial material may be maintained also subsequent to the treatment process.

The treatment process may include a wet etching step with an HF-based etchant. The HF-based etchant may be a diluted HF-etchant.

The sacrificial material may be an organic material wherein the treatment process may include an $H_2$ plasma etchant. An $H_2$ plasma may improve the hydrophobicity of exposed surfaces of the sacrificial material. Typically, by promoting formation of hydrophobic methyl groups. Advantageous choices of the sacrificial material include amorphous carbon (aC), a photoresist material or other organic material. At least one of the material lines and the target layer may be formed by a nitride-based material (e.g. TiN or SiN) or an oxide material (e.g. $SiO_2$). The hydrophobicity of such materials will typically not be increased when subjected to an $H_2$ plasma.

According to one embodiment the treatment process is adapted to increase a hydrophilicity of one or more of the surface portions inside the hole.

The treatment process may additionally or alternatively be adapted to increase the hydrophobicity of exposed surface portions of the sacrificial material.

By increasing at least one of a hydrophilicity of one or more of the surface portions of the target layer and material lines exposed in the hole, and a hydrophobicity of exposed surface portions of the sacrificial material, a functionalization of desired surface portions, and optionally a passivation of the desired surface portions, may be achieved with respect to deposition processes, in particular deposition by an atomic layer deposition process.

Treatment processes increasing a hydrophilicity and/or hydrophobicity of different materials may include etching processes, such as the aforementioned $H_2$ plasma etching. Alternatively, the treatment process P may include selective deposition of a self-assembled monolayer (SAM) on exposed portions of the sacrificial material. The SAM may have a hydrophobic tail group. The SAM may have a head group adapted to bond to exposed surfaces of the sacrificial material but not to at least one of the exposed surface portion of the target layer and the exposed sidewall surface portions of the material lines in the hole. The sacrificial material may be an oxide material and at least one of the material lines and the target layer may be formed by a non-oxide material wherein the head group of the SAM may be adapted to bond to the oxide material and not to the non-oxide material.

The fill material forming the block mask may be a metal material. Metals typically provides a strong etch contrast with respect to target layers of many different materials. A metal block mask may hence form a strong etch mask.

The fill material may advantageously be formed by Ru, Cu, Ni or Co. Such metals may be grown by selective deposition processes including atomic layer deposition (ALD) electro-less deposition (ELD).

The fill material forming the block mask may alternatively be a dielectric material. Dielectric material may be grown by selective deposition processes including ALD.

According to one embodiment the deposition process includes depositing the fill material using an ALD process. An ALD process enables growth of material with an accurate control of the deposition rate. Selecting the precursors of the ALD processes enables control of which material surfaces the fill material will nucleate on. The hole may be filled by the ALD of the fill material.

According to one embodiment the fill material is a metal material wherein the deposition process includes depositing the fill material using an ELD process. ELD process enables highly selective deposition of a metal fill material, advantageously Ru, Cu, Ni or Co. The hole may be filled by the ELD of the fill material. The sacrificial material may be a non-metal. At least one of the material lines and the target layer may be formed by a metal (advantageously of the same metal as the fill material) wherein the fill material may be selectively deposited by ELD on the at least one surface in the hole. The deposition of the fill material may occur selectively on some but not all surfaces within and outside the hole, using various techniques described below. For example, the deposition may occur selectively on one or more of the bottom surface formed by, e.g., the exposed target layer and/or sidewall surfaces of the hole formed of the sacrificial material layer 116 or the material lines 110. The deposition may be selective against remaining surfaces and/or against the top surface of the sacrificial material layer 116.

By electro-less deposition (ELD), or synonymously electro-less plating or auto-catalytic plating, of a metal material on a surface is hereby meant deposition of the metal material on the surface, wherein the surface acts as an electrode and catalyst for a reduction of metal ions to form the metal material. The metal ions may be dissolved in a solution. The solution may typically be an aqueous solution. The solution may further include a reducing agent.

According to one embodiment the fill material is a metal material and wherein the deposition process includes depositing a metal seed layer on at least one of the surface portions inside the hole using an atomic layer deposition process and subsequently filling the hole with the fill material using an electro-less deposition process. One or more of the surface portions inside the hole may thereby be provided with a metal surface allowing further ELD deposition of the fill material thereon. ELD typically allows deposition of greater selectivity than ALD. Hence, combining ALD and ELD enables highly selective deposition of a metal fill material in the hole while minimizing deposition of the metal material outside the hole. The metal seed layer is advantageously formed by a same metal material as the fill material. The metal seed layer is advantageously deposited to form a (thin) film or coating on the one or more surface portions, wherein the fill material is further deposited by ELD on the film or coating.

A material of the target layer may be different from a material of the material lines.

The target layer may be any layer or layer stack having the ability to withstand, and accordingly remain at least partially following the process for forming the material lines and the removal of the sacrificial layer.

In addition, a target layer forming a mask layer arranged on a dielectric layer may be any layer or layer stack having the ability to withstand, and accordingly remain at least partially following, a transfer of the pattern of the mask layer into the dielectric layer.

The mask layer may advantageously be a non-resist based mask layer. The mask layer may advantageously be a "hard" mask layer. The mask layer may include TiN, SiN, SiCN, $SiO_x$, $TiO_x$, $HfO_x$ or $ZrOx_x$. The mask layer may also be a layer stack including sub-layers of the materials.

The sacrificial material may be different from the fill material and a material of the material lines. This enables a selective removal or selective etching of the sacrificial material from the gaps between the material lines.

By removal of a material "A", selectively to a material "B", is hereby meant that a feature of material A arranged adjacent to a feature of material B may be removed while preserving the feature of material B. This may be achieved by selecting material "A" and material "B" as a combination of materials presenting different etch rates in a given etch process. The preservation of the feature of material B following the etch process may be complete (in the sense that the feature of material B not is affected appreciably during the etch process) or at least partial (in the sense that the feature of material B remains at least to the extent that it may serve its intended function during subsequent process steps). A ratio of an etch rate of the material "A" compared to an etch rate of the material "B" may advantageously be 2:1 or higher, but more preferably 10:1 or higher, or even more preferably 40:1 or higher.

The sacrificial material may be formed of oxide material, a-C, a-Si, spin-on-carbon (SOC), a spin-on oxide or dielectric.

The material lines may be formed of TiN, SiN, SiCN, $SiO_x$, $TiO_x$, $HfO_x$ or $ZrO_x$. The material lines may also be formed of a-C, a-Si, SOC, photo resist material or silicon carbide nitride.

According to one embodiment, filling the gaps with the sacrificial material includes forming a sacrificial material layer filling the gaps and covering the material lines. The gaps may hence be reliably filled with sacrificial material by forming of a single material layer.

The sacrificial material layer may include an upper thickness portion arranged above the material lines and a lower thickness portion arranged within the gaps, wherein the hole includes an upper hole portion extending through the upper thickness portion and a lower hole portion extending through the lower thickness portion. By forming the hole to extend through the upper and lower thickness portions, a mouth of the hole may be arranged at a level above the top surface of the material lines. The upper thickness portion of the sacrificial material layer may protect the material lines from being exposed from possibly adverse process steps preceding the removal of the sacrificial material. Moreover, the upper thickness portion of the sacrificial material layer may counteract growth of the fill material on surface portions of the material lines outside the hole. Additionally, the upper thickness portion of the sacrificial material layer may counteract deposition of the fill material on upper surfaces of the material lines. This may increase the flexibility in terms of choice of material for the material lines as passivation of the surfaces of the material lines is not necessary.

Alternatively, the method may further comprise reducing a thickness of the sacrificial material layer to expose a top surface of the material lines, prior to forming the hole. An upper thickness portion of the sacrificial material layer arranged above the material lines may thus be removed prior to the forming of the hole. This may simplify alignment of the hole with the intended gap. In this case, it may be advantageous that the above-mentioned treatment process is further adapted to passivate also exposed surface portions of the material lines with respect to the deposition process.

According to one embodiment the method further comprises forming at least a second hole by removing the sacrificial material along a portion of a second one of the gaps, the second hole extending across the second gap and exposing a second surface portion of the target layer and sidewall surface portions of material lines on opposite sides of the second gap, wherein during the deposition process the fill material grows selectively also on the one or more surface portions inside the second hole, thereby forming a second block mask extending across the second gap.

Hence two or more holes may be formed, enabling forming of two or more block masks and, accordingly, forming of two or more interrupted trenches in the target layer.

In case a treatment process is performed in a manner set out above, the treatment process may functionalize, with respect to the subsequent deposition process, one or more of the surface portions inside also the second hole.

According to one embodiment the method further comprises, subsequent to removing the sacrificial material and prior to transferring a pattern into the target layer:

forming a conformal layer covering the target layer, the material lines and the block mask, and etching the conformal layer anisotropically such that the target layer is exposed in the gaps and portions of the conformal layer remain on sidewalls of the material lines and the block mask (and the second block mask if present).

This allows critical dimensions of the material lines and the block mask(s) to be restored, in the event that one or more process steps, in particular the act of removal of the sacrificial layer, have resulted in loss of material from the material lines or the block mask(s).

By an "anisotropic" etch is hereby meant an etch process etching preferentially, i.e. having an etch rate which is greater, along a main direction. To expose the target layer in the gaps and leave portions of the conformal layer on the sidewalls, the etching may be performed mainly (i.e. the direction of greater etch rate may be oriented) along a vertical direction.

According to one embodiment the target layer forms a mask layer arranged on a dielectric layer wherein the method further comprises transferring a pattern of the mask layer into the dielectric layer. The set of trenches, including one or more interrupted trenches, may accordingly be transferred into the dielectric layer. The dielectric layer may be a dielectric layer of a metallization level which is to be formed.

The set of trenches in the dielectric layer may subsequently be filled with a conductive material to form conductive lines in the dielectric layer. The one or more interrupted trenches allow forming of one or more interrupted conductive line.

The trenches may be at least partially filled with a conductive material. The conductive material may be a single metal or a mixture or alloy of metals or of a metal and another material. A complete filling of the trenches is advantageous since it allows the entire cross-sectional area, allowed by the trenches in the dielectric layer, to be filled by the conductive material to obtain a low-resistance interconnect structure.

The act of filing with a conductive material may comprise forming the conductive material also above the dielectric layer and removing the conductive material in locations outside of the trenches of the dielectric layer. The removing of excess conductive material may divide the deposited conductor into separate paths extending within the trenches of the dielectric layer.

The act of filing with a conductive material may be performed subsequent to removing the mask layer from the dielectric layer.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

A method for patterning a target layer will now be described with reference to FIGS. 1a-1h.

Figure 1A:
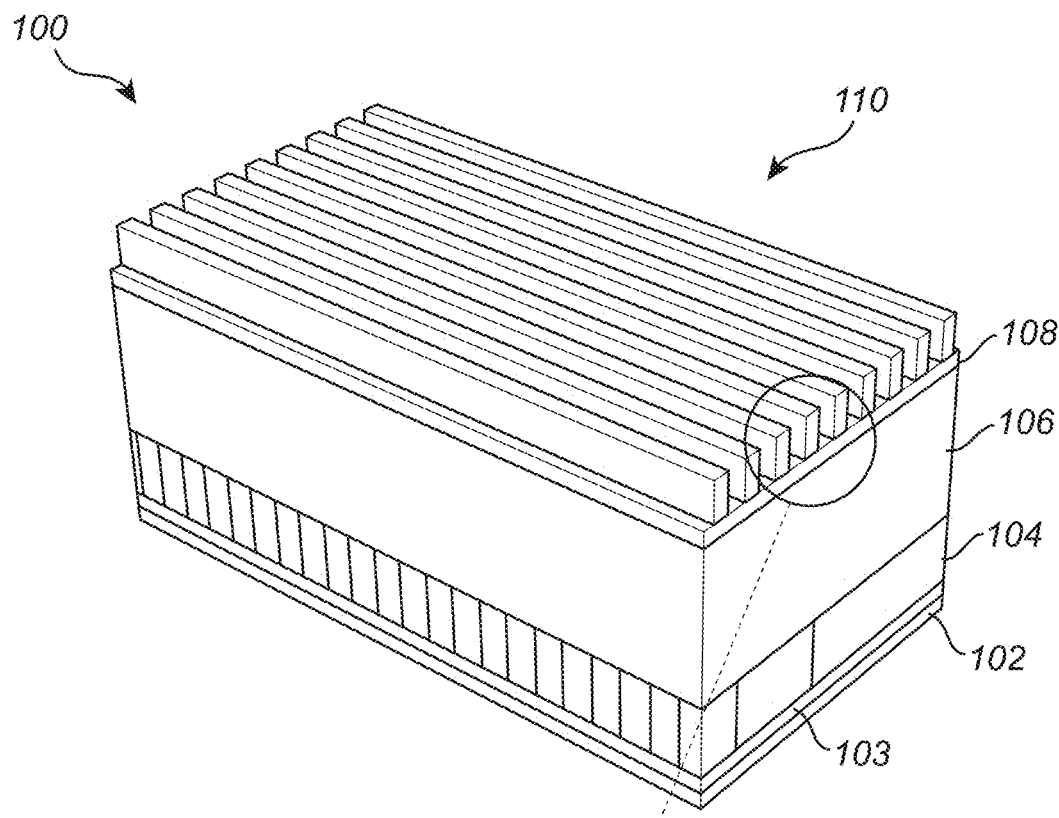
FIGS. 1a-1h schematically illustrate a method for patterning a mask layer according to embodiments.

The method comprises forming on a target layer 108 a plurality of lines extending in a first direction, e.g., parallel material lines 110, that are spaced apart laterally by gaps. Adjacent ones of the lines are separated by a gap, a space or a trench, such that longitudinal gaps 114 exposing the target layer 108 are formed between the material lines 110 (FIGS. 1a,b). The method comprises filling the gaps 114 with a sacrificial material 116 (FIG. 1c). The method comprises forming a hole 118 by removing the sacrificial material 116 along a portion of one gap 114a of the gaps 114. The hole 118 extends across the gap 114a and exposes a surface portion of the target layer 108 in the gap 114a, and exposes sidewall surface portions of material lines 110a, 110b on opposite sides of the gap 114a (FIG. 1d). The method comprises performing a selective deposition process adapted to grow a fill material selectively on one or more surface portions inside the hole, thereby forming a bridging structure such as a block mask 124 extending across the gap 114a (FIG. 1e). The method comprises removing, selectively against the material lines 110 and the block mask 124, the sacrificial material 116 from the target layer 108 to expose the gaps 114, the one gap 114a being interrupted in the longitudinal direction by the block mask 124 (FIG. 1f). The method comprises transferring a pattern including the material lines 110 and the block mask 124 into the target layer 108 (FIG. 1g). According to embodiments, one or both of the width of the material lines 110 and/or the width of the spaces between the material lines 110 are sub-lithographic, e.g., below the minimum dimension that can be accurately printed using the lithography tool, and can be formed using one of several techniques discussed below.

In some embodiments, a plurality of alternating lines and spaces as illustrated in FIG. 1a can have sub-lithographic features sizes, e.g., one or both of widths of the material lines 110 and/or the gaps or spaces therebetween. The sub-lithographic feature sizes can be achieved using various techniques such as pitch multiplication or multiple pattering techniques. However, some of these techniques may not be adapted for forming deviations from the relatively simple lines and spaces, such the ones illustrated in FIG. 1a. For example, when deviations such as bridging structures are formed in addition to the lines and gaps, the minimum feature sizes of the lines, gaps and/or the bridging structures that can be accurately patterned may undesirably increase. By patterning the lines and the bridging structures sequentially as described herein, their minimum feature sizes can be kept relatively small. In addition, advantageously, when formed on a planar surface, the block mask 124 can have a width that is greater than the width of the spaces. However, because the block mask 124 is partially formed over adjacent material lines 110 as described further in detail below, the actual feature width of the block mask 124 is smaller because of being limited by the width of the gap between adjacent material lines 110. Thus, the dimensional criticality of the optical and etch mask for forming the block mask 124 is reduced, which can in turn reduce cost.

The method will be described in connection with forming of conductive lines of a metallization level of a semiconductor structure, wherein the target layer forms a mask layer 108, arranged on a dielectric layer 106. In particular, the method enables forming of trench interruptions or blocks in advanced semiconductor manufacturing. It is however noted that the method has a more general applicability for forming trenches, including interrupted trenches, in a target layer.

With reference to FIG. 1a there is shown, in perspective, a section of a semiconductor structure or intermediate device 100. The structure 100 may extend laterally or horizontally beyond the illustrated section. The illustrated planes of section extending through the structure 100 are common to all the figures.

It is noted that the relative dimensions of the shown elements, in particular the relative thickness of the layers, is merely schematic and may, for the purpose of illustrational clarity, differ from a physical structure.

The structure 100 includes in a bottom-up direction a semiconductor substrate 102. An active device layer 103 including semiconductor devices such as transistors are fabricated on a main surface of the substrate 102. The active device layer 103 may also be referred to as a front-end-of-line portion (FEOL-portion 103). In FIG. 1a, a first metallization level 104, including conductive lines arranged in a dielectric layer, is formed above the FEOL-portion 103.

The structure 100 includes a dielectric layer 106. The dielectric layer 106 forms a dielectric layer of the metallization level which is to be formed. The dielectric layer 106 may include a silicon oxide layer, for instance $SiO_2$, or another low-K dielectric material. Although not shown in FIG. 1a, the dielectric layer 106 may include a stack of layers of different dielectric materials, such as an interface layer and/or an oxide capping layer.

A target layer in the form of a mask layer 108, e.g., which can be a hard mask layer, is formed on the dielectric layer 106. The mask layer 108 covers an upper surface of the dielectric layer 106. The mask layer 108 may form a hard mask layer. The mask layer 108 may be formed by a layer of TiN. The mask layer 108 may also be formed by a layer of SiN, SiCN, $SiO_x$, $TiO_x$, $HfO_x$ or $ZrO_x$. The mask layer 108 may also be an alloy, for instance a ruthenium or aluminum alloy. The mask layer 108 may alternatively, be a stack of sub-layers of the materials. The mask layer 108 may also be formed by amorphous carbon (a-C) amorphous silicon (a-Si) or $H_2$-terminated silicon or a hydrocarbon material, or some other non-oxide material. The mask layer 108, or the sub-layers thereof, may be formed by atomic layer deposition (ALD), chemical vapor deposition (CVD) or physical vapor deposition (PVD).

A grating of a plurality of material lines 110 is formed on the mask layer 108. The material lines 110 may be formed by SiN. The material lines 110 may also be formed by TiN, SiCN, $SiO_x$, $TiO_x$, $HfO_x$ or $ZrO_x$. The material lines may also be formed of a-C, a-Si, spin-on-carbon (SOC), a photoresist or an oxide. The materials of the material lines 110 and of mask layer 108 are selected to be different materials, to allow etching of the mask layer 108 using the material lines 110 as an etch mask as will be further described below. The material lines 110 are elongated and extend in parallel to each other. The material lines 110 are regularly spaced apart such that longitudinal gaps 114 are formed between the material lines 110. The gaps 114 present a regular width and spacing. The plurality of material lines 110 may also be referred to as a grating layer 110.

Figure 1B:
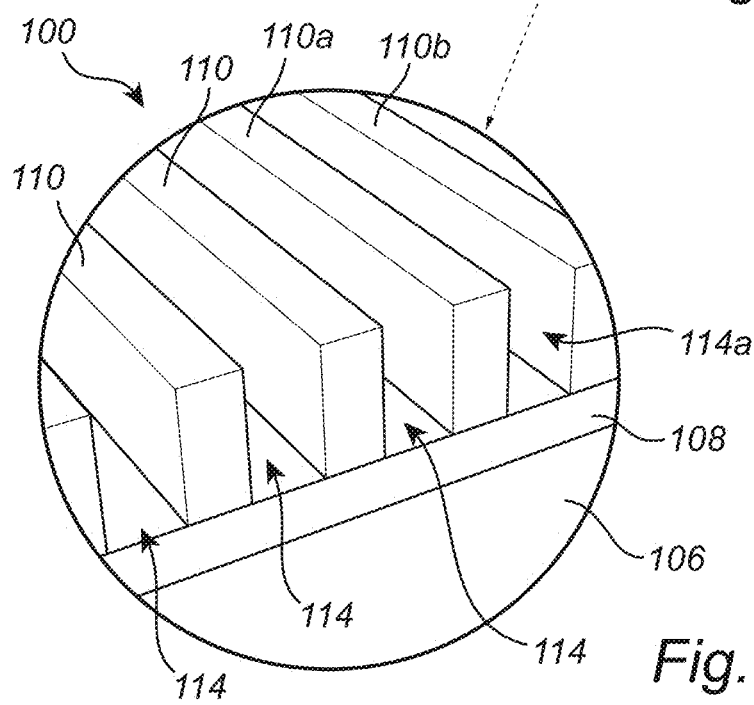
Figure 1C:
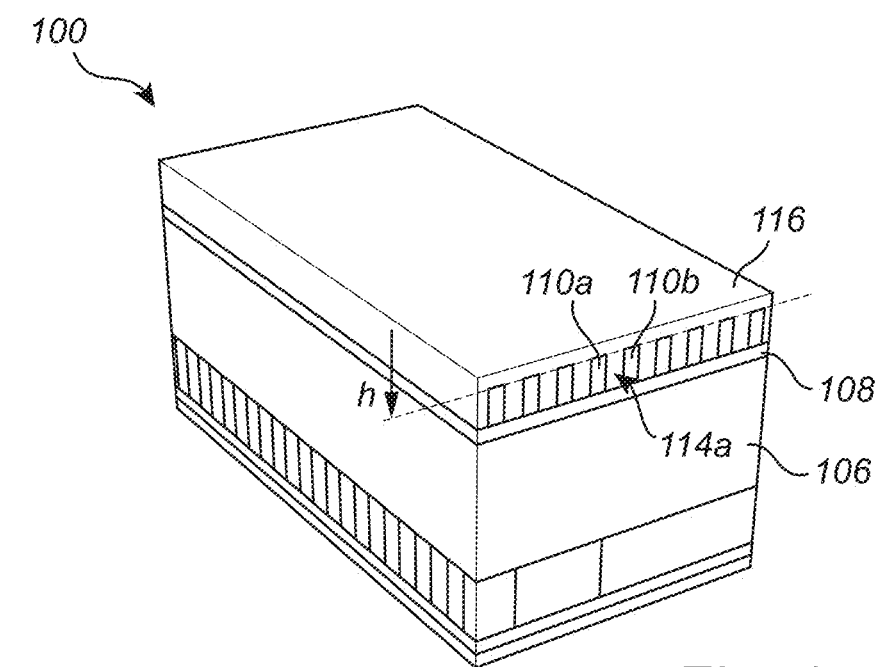
Figure 1D:
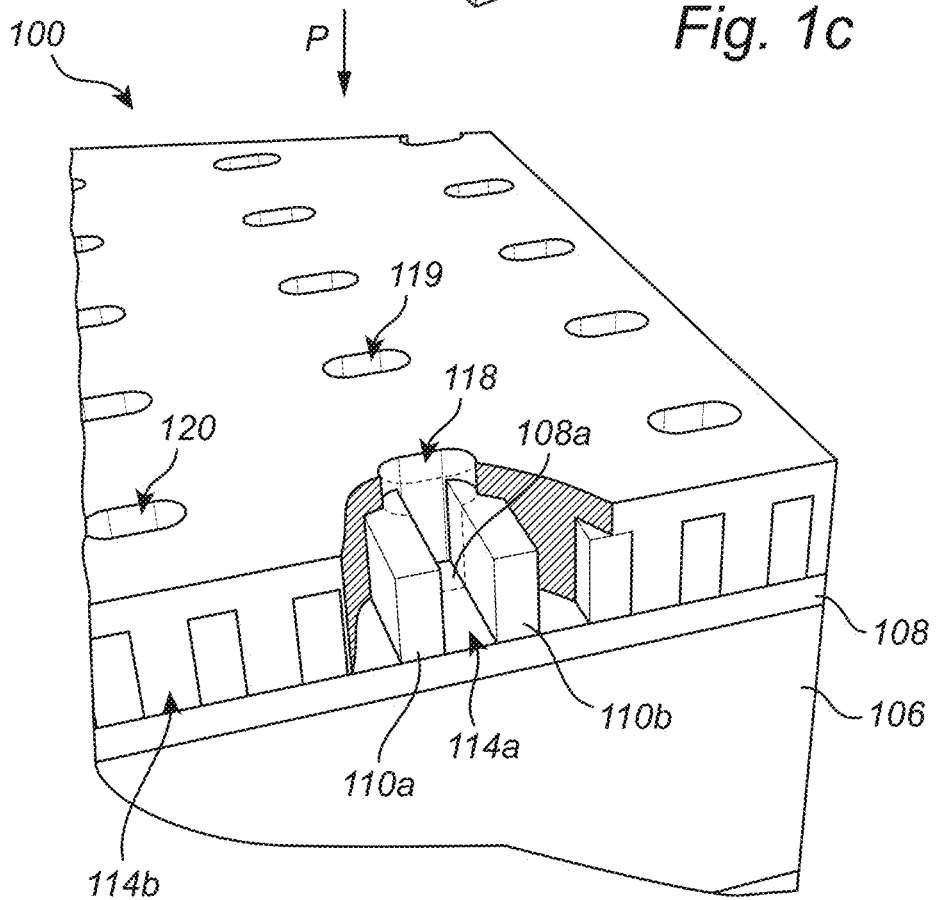
Figure 1E:
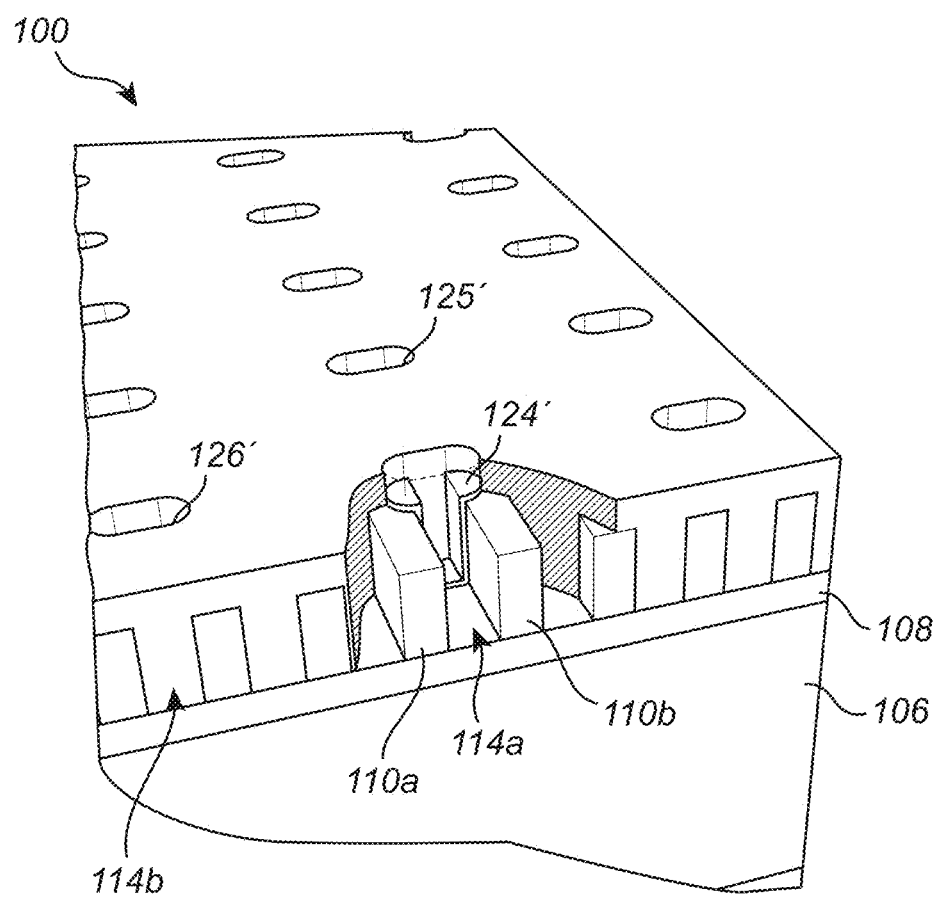
Figure 1F:
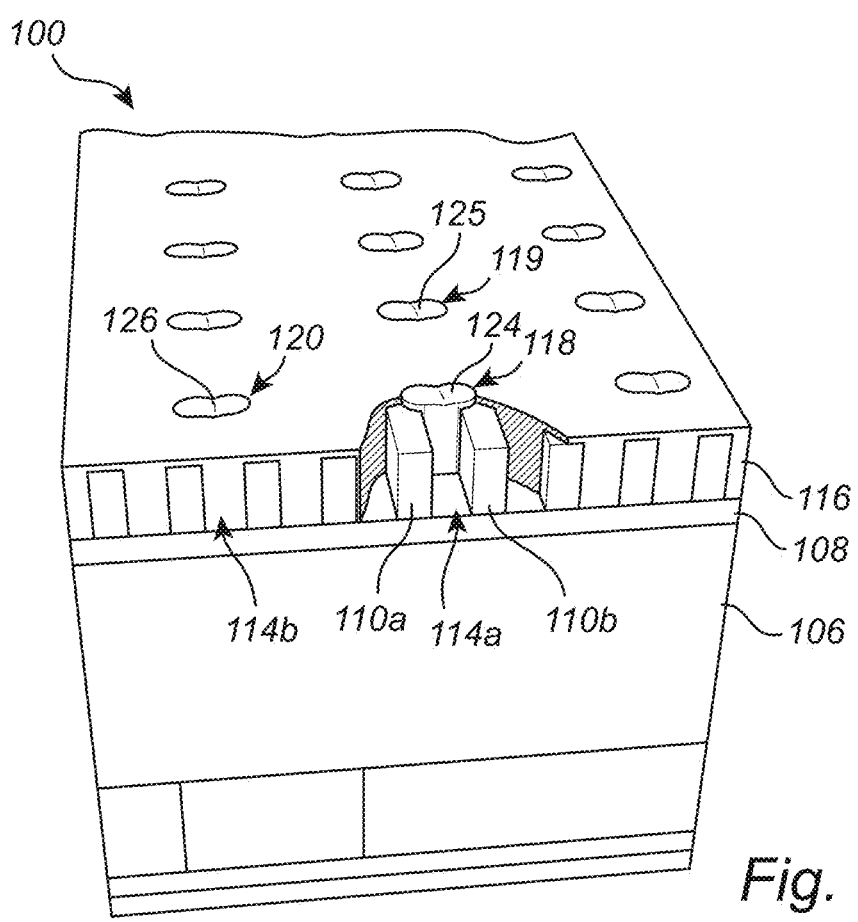
Figure 1G:
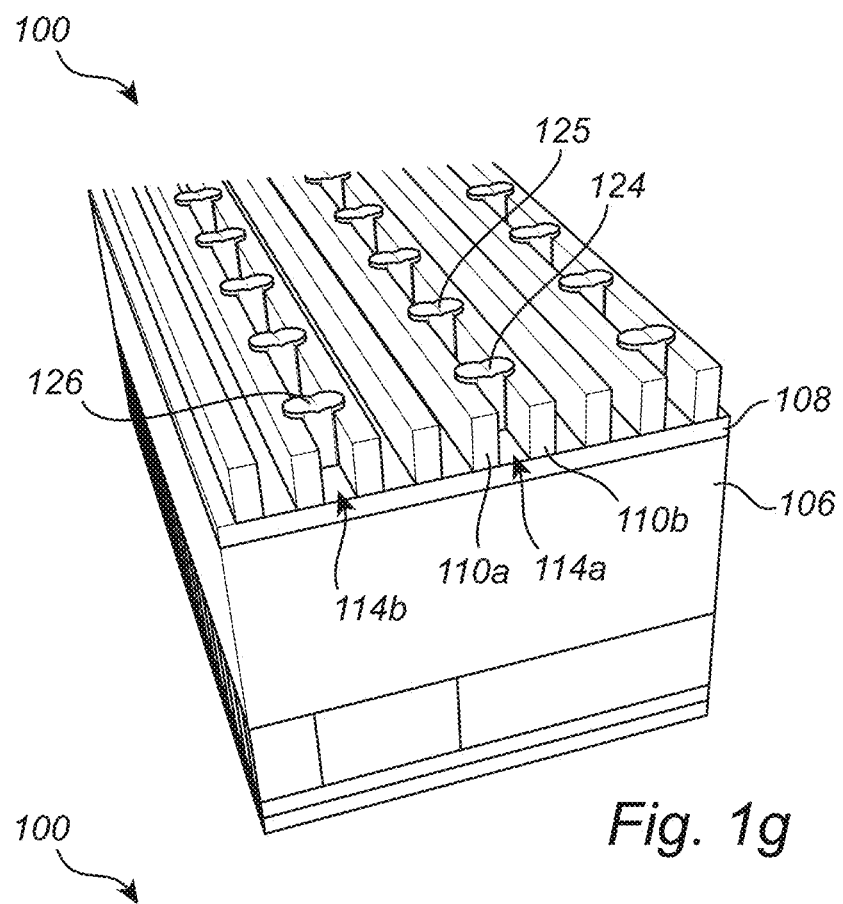

FIG. 1b is an enlarged view of the structure 100, showing more clearly material lines 110 and gaps 114. The material lines 110a and 110b represent, respectively, a first material line 110a and an adjacent second material line 110b. The first material line 110a and the second material line 110b are separated by a gap 114a. Each material line 110 presents, as shown, a pair of opposite sidewalls and a top surface.

Forming of the plurality of material lines 110 may including forming a line material layer on the mask layer 108. The line material layer may be formed by any of the above-mentioned materials. The line material layer may be deposited using a deposition process suitable for the selected material. Examples of deposition processes include chemical vapor deposition (CVD), physical vapor deposition (PVD), atomic layer deposition (ALD) and spin-coating. The plurality of material lines 110 may then be formed by patterning the line material layer. In some embodiments, the plurality of material lines 110 may be formed using a single lithography-etching process, e.g., using a single optical mask (e.g., a reticle) and a single etch mask (e.g, phororesist or a hard mask). Material lines 110 with a line width and a line spacing corresponding to the resolution of the lithographic process may thereby be formed. In some other embodiments, the plurality of material lines 110 may also be formed in a multiple patterning process, e.g., using multiple optical masks and multiple etch masks. Material lines 110 with a line width and a line spacing with sub-lithographic dimensions may thereby be formed. Examples of multiple-patterning techniques include (litho-etch)$^x$, or pitch multi-plication or splitting techniques such as self-aligned double patterning (SADP) or quadruple patterning (SAQP).

With reference to FIG. 1c, a sacrificial material layer 116 of sacrificial material has been formed to fill the gaps 114 and to cover the material lines 110. The sacrificial material may be an oxide material, an a-C material, an a-Si material, a SOC material or a spin-on oxide or dielectric. The sacrificial material layer 116 may be deposited in an ALD process, for instance a plasma-enhanced-ALD (PEALD) process, or by CVD, electron-beam evaporation or sputtering.

The sacrificial material is selected to be different from the material lines 110 and of the mask layer 108 to allow selective removal of the sacrificial material from the mask layer 108 and the material lines 110. The sacrificial material is further selected to be different from the material lines 110 and of the mask layer 108 to allow selective deposition of a fill material in holes to be formed in the sacrificial material layer 116, as will be further described below. Thus, a plurality of material lines 110 alternating with a plurality of sacrificial material lines are formed.

Depending on the type of sacrificial material and the deposition process, a planarization of the sacrificial material layer 110 may be performed, for instance by chemical mechanical polishing (CMP). As indicated by the dashed line h, a thickness of the sacrificial material layer 116 may optionally be reduced such that the top surfaces of the material lines 110 are exposed.

However, in the following description, it will be assumed that the thickness reduction, if performed, stops before the material lines 110 are exposed. Accordingly, the sacrificial material layer 116 includes an upper thickness portion arranged above the material lines 110 and a lower thickness portion arranged within the gaps 114.

With reference to FIG. 1d, an opening or a hole 118 has been formed by removing sacrificial material along a portion of the gap 114a. In FIG. 1d, a section of the sacrificial material layer 116 has been removed to allow a view of the hole 118. The hole 118 extends across the gap 114a and exposes the mask layer 108, more specifically a surface portion 108a of the mask layer 108. The mask layer portion 108a forms a bottom surface of the hole 118. The hole 118 exposes a sidewall portion of the material line 110a and a sidewall portion of the material line 110b. Advantageously, the lithography and etch process of forming the hole 118 can be designed such that the width of the hole 118 is wider than the width of the space between the adjacent material lines 110. For example, an etch mask having an opening having a width wider than a width of the gap can be used, wherein the opening in the etch mask laterally encompasses the width of the gap between adjacent material lines 110. For example, the opening may have a width that is smaller than a combined width of adjacent material lines 110 and the gap therebetween. Subsequently, the sacrificial material layer 116 may be etched using the etch mask to form a hole through the sacrificial material layer 116 in the gaps, where the hole has a width limited by the width of the space. As illustrated in FIG. 1d, the width the hole is limited by the width of the space between the adjacent material lines 110, such that the dimensional criticality of the optical and etch mask used for forming the hole 118 is reduced.

The hole 118 includes an upper hole portion extending through the upper thickness portion of the sacrificial material layer 116. The hole 118 includes a lower hole portion extending through the lower thickness portion of the sacrificial material layer 116, i.e. inside the gap 114a. An opening or mouth of the hole 118 is arranged at the top surface of the sacrificial material layer 116. The mouth of the hole 118 is hence arranged at a level above the top surface of the material lines 110.

As shown in FIG. 1d, a plurality of holes may also be formed, including for instance holes 119 and 120. The hole 119 is formed along the same gap 114a as the hole 118, however at a different longitudinal position along the gap 114a. The hole 120 is formed along a different gap 114b than the hole 118. The above description of the hole 118 otherwise applies correspondingly to the holes 119, 120 otherwise. It is noted that the number of holes shown in figures merely represent an example and that the method generally may include forming of any number of holes, however at least one hole.

The holes 118, 119, 120 may be formed by depositing an etch mask or a patterning layer, which can include a lithographic layer stack on the sacrificial material layer 116. The layer stack may be a conventional lithographic stack arranged to allow formation of holes with dimensions corresponding to the critical dimensions of the material lines 110. As a non-limiting example, a layer stack may include, in a bottom up direction, a SOC layer, a spin-on-glass SOG layer and a photo-resist layer. Holes may be patterned in the photo-resist layer in a lithographic process, which holes may be transferred into the layer stack and into the sacrificial material layer 116. A number of lithographic and etch steps may be performed to facilitate forming of a plurality of holes. A dry etching process may be used for etching the holes 118, 119, 120. The etching process may be of any type allowing etching of the sacrificial material, selectively from the material of the mask layer 108, and preferably also from the material of the material lines 110.

In FIG. 1d, the holes 118, 119, 120 extend across only a single gap 114. However, it is also possible to form a hole with a greater width such that a single gap covers more than one gap, such as two or three consecutive gaps 114. As may be understood from the following, this enables simultaneous forming of two or more block masks, at corresponding longitudinal positions within two or more consecutive gaps.

As schematically indicated in FIG. 1d, the structure may be subjected to a treatment process P. The treatment process P is adapted to functionalize, with respect to the subsequent deposition process of the fill material, one or more of the surface portion 108a and the sidewall portions of the material lines 110a, 110b exposed in the hole 108, and the corresponding surface portions in the further holes 119, 120. The treatment process P may further be adapted to passivate the exposed surface portions of the sacrificial material layer 116, with respect to the deposition process.

The treatment process P may include subjecting the structure to an etching step. The etching step may include subjecting the structure to a wet HF-etchant, preferably a diluted HF-etchant. An HF-etchant is advantageously used in combination with at least one of the material lines 110 and the target layer 108 being formed by a non-oxide material, such as TiN, SiN, a-C, a-Si—$H_2$-terminated silicon or a hydrocarbon material. The etchant may remove oxide coatings or thin films formed on the portions of the mask layer 108 exposed inside the holes 118, 119, 120. Oxide coatings or thin films formed on sidewall surface portions of the material lines (e.g. 110a, 110b) exposed inside the holes 118, 119, 120 may also be removed. If the sacrificial material layer 116 is oxide-based (e.g. of oxide material such as $SiO_x$, a spin-on oxide or dielectric), the surface portions of the sacrificial material layer 116 may at least maintain initially passive properties with respect to the deposition process. If residues have formed on the sacrificial material layer 116 during the prior processing the etching step may further remove such residues. Thereby an oxide surface of increased purity may be obtained on the sacrificial material layer 116 such that the sacrificial material layer 116 is (further) passivated with respect to the deposition process.

The treatment process P may alternatively include a H2/N2 plasma etchant and/or $H_2$ plasma etchant. An $H_2$-including plasma etchant is advantageously used in combination with a sacrificial material layer 116 of a-C, spin-on-carbon material, a photoresist material or carbon-including advanced patterning films (APFs). An $H_2$ plasma may thus promote formation of hydrophobic methyl groups on the sacrificial material layer 116. If at least one of the material lines 110 and the mask layer 108 is formed by a nitride-based material (e.g. TiN, SiN, SiCN) or an oxide material (e.g. SiO2), the $H_2$ plasma will typically not appreciable increase the hydrophobicity of the surface portions exposed in the holes 118, 119, 120.

Alternatively, the treatment process P may include selective deposition of a SAM-layer on the sacrificial material layer 116. The SAM may have a hydrophobic tail group and a head group adapted to bond to exposed surfaces of the sacrificial material layer 116 but not to at least one of the exposed surface portion of the mask layer 108 and the exposed sidewall surface portions of the material lines 110 in the holes 118, 119, 120. For instance, the sacrificial material layer 116 may be an oxide material and at least one of the material lines and the target layer may be formed by a non-oxide material wherein the head group of the SAM may be adapted to bond to the oxide material and not to the non-oxide material. Alternatively, or additionally, a SAM may be selectively deposited at least one of the exposed surface portion of the mask layer 108 and the exposed sidewall surface portions of the material lines 110 in the holes 118, 119, 120, the SAM having a hydrophilic tail group. The hydrophobicity of one or more surface portions in the holes 118, 119, 120 may thereby be increased. [0091] With reference to FIG. 1f, a deposition process adapted to grow the fill material selectively on the one or more surface portions inside each of the holes 118, 119, 120 has been performed. Block masks 124, 125, 126 have accordingly been formed in the holes 118, 119, 120 respectively.

The deposition process may be an ALD process. An ALD process may be used to deposit either a metal fill material (for instance Ru, Cu, Ni or Co) or a dielectric fill material (for instance $TiO_2$, $HfO_2$ or $SiO_x$). The ALD may result in deposition of the fill material on surfaces functionalized as set out above while growth of the fill material on surfaces passivated as set out above may be counteracted. By way of example, Ru may be deposited, using a metal-organic precursor such as EBECHRu, on a surface of TiN, SiN, SiCN or $SiO_x$, treated by an $H_2$ plasma. Suitably corresponding precursors for ALD of Cu, Ni or Co may be used. Alternatively, Ru may be deposited, using a precursor such as $RuO_4$, on a non-oxide surface such as TiN, SiN, a-C, a-Si—$H_2$-terminated silicon or a hydrocarbon material, treated by an HF-etchant.

The holes 118, 119, 120 may be completely filled by the ALD of the fill material. Alternatively, as shown in FIG. 1e, the deposition process may include an initial ALD of a seed layer 124', 125', 126' on the surface portions of the mask layer 108 and the material lines 110 in the holes 118, 119, 120, respectively. The seed layers 124', 125', 126' may be formed by ALD of Ru, Cu, Ni or Co. Subsequent to the deposition of the seed layers 124', 125', 126' the remaining spaces in the holes 118, 119, 120 may be filled by deposition of further metal such as Ru, Cu, Ni or Co in the hole by ELD. The seed layer material and the fill material may be the same material or different materials. The metallic surface of the seed layers 124', 125', 126' enables deposition of further metal fill material on the seed layers by ELD. Provided the sacrificial material layer 116 is formed of a non-metal material a highly selective deposition of the fill material may accordingly be achieved.

Although in the above the method has been disclosed to include a treatment process P prior to the selective deposition process, it is possible to omit the treatment process for instance if the reactive and passive properties, respectively, with respect to the deposition process are sufficient to enable selective deposition without a pre-treatment. For instance, selective deposition by ALD of a dielectric fill material or a Ru—Cu—, Ni— or Co-fill material may be achieved without a pre-treatment on a structure including a mask layer 108 of TiN, material lines 110 of SiN and a sacrificial material layer 116 of an oxide such as $SiO_2$. Also, selective deposition by ELD of a Ru—, Cu—, Ni— or Co-fill material may achieved without a pre-treatment on a structure including a mask layer 108 of a metal (or a non-metal target layer 108 on which a metal seed layer has been deposited), material lines 110 of SiN and a sacrificial material layer 116 of an oxide such as $SiO_2$.

Additionally, it should be noted that the fill material need not be deposited to completely fill the holes 118, 119, 120. However, the holes should at least be filled to such an extent that a respective block mask 124, 125, 126 is formed which bridges the gap 114 in which the respective block mask is formed.

With reference to FIG. 1g, the sacrificial material 116 has been removed, selectively to the material lines 110 and the block masks 124, 125, 126. The gaps 114, in particular the portions of the mask layer 108 in the gaps 114, have thereby been exposed.

The sacrificial material 116 may be removed by wet etching or dry etching. The etching chemistry may be adapted to etch the sacrificial material 116 with a first etch rate and the material of the material lines 110 and the block masks 124, 125, 126 with a second etch rate, the second etch rate being lower than the first etch rate. Etching chemistries allowing selective removal of for instance an oxide sacrificial material 116 from for instance nitride-based or metal materials are a buffered hydro fluoric acid (bHF) etch or a diluted HF (dHF). Other possible etching processes include a fluorine-based plasma RIE or remote plasma assisted dry etch processes. It may be noted that the removal of the sacrificial material 116, although being selective, still may etch the material lines 110 and the block masks 124, 125, 126 to some extent. However, by an appropriate selection of the etching process and the materials (of the material lines 110, the block mask 124, 125, 126 and the sacrificial material 116), the sacrificial material 116 may be removed while preserving the material lines 110 and the block masks 124, 125, 126 to an extent such that the material lines 110 and the block mask 124, 125, 126 may act as an etch mask during a subsequent pattern transfer into the mask layer 108, described below.

As shown in FIG. 1f, the gap 114a is interrupted in the longitudinal direction by the block mask 124. The block mask 124 is arranged in abutment with the material line 110a and the material line 110b. The block mask 124 extends across the gap 114a, transverse to the longitudinal direction of the gap. The block mask 124 hence bridges the gap 114a and connects the material line 110a and the material line 110b. A further longitudinal interruption of the gap 114a is formed by the block mask 125. The gap 114b is interrupted by, among others, the block mask 126.

Figure 1H:
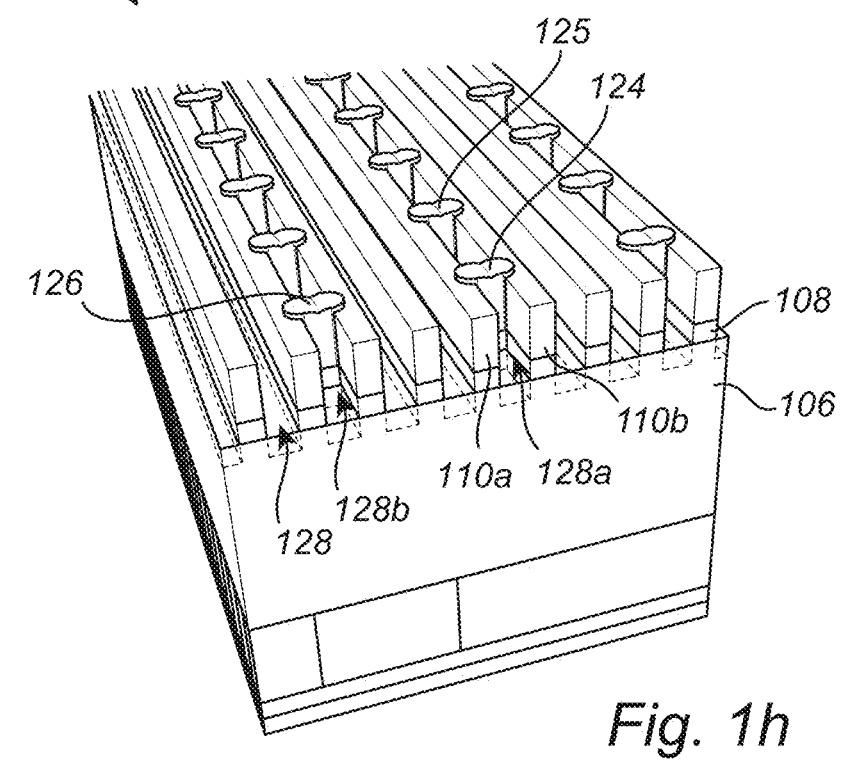

With reference to FIG. 1h, the pattern defined by the material lines 110 and the block masks 124, 125, 126 has been transferred into the mask layer 108. The mask layer 108 has been etched while using the material lines 110 and the block masks 124, 125, 126 as a combined etch mask. A wet etching process with etching chemistry of $HNO_3$ or bHF may be used for etching the mask layer 108. A dry etching process with $CHF_3$, $CF_4$ or $Cl_2$ based plasmas may be used for etching of the mask layer 108.

As shown in FIG. 1h, the mask layer 108 has accordingly been patterned to include trenches 128. As may be seen, the trench 128a is interrupted at the longitudinal positions of the block masks 124, 125. Correspondingly, the trench 128b is interrupted at the longitudinal position of the block mask 126. The trenches 128a,b hence form interrupted or discontinuous trenches.

As indicated by the dashed lines in the dielectric layer 106 in FIG. 1h, the trenches 128 may further be transferred into the dielectric layer 106. The pattern transfer may be performed by an anisotropic etch process. The etch process may be a plasma-based etching process. The etch process may be a reactive ion etching (RIE) process. For instance, F-based plasmas may be used for selectively etching a silicon oxide-based dielectric layer 106 with respect to a mask layer 108 of for instance titanium nitride, titanium oxide, hafnium oxide or zirconium oxide.

Following the pattern transfer into the dielectric layer 108, the mask layer 108 may be removed. The mask layer 108 may be removed for instance using a same etching process as mentioned in connection with the pattern transfer into the mask layer 108. Additionally, the material lines 110 and the block masks 124, 125, 126 may be removed.

The trenches in the dielectric layer 106 may subsequently be filled with a conductive material to form the conductive paths or lines of the metallization level. The conductive material may be a single metal such as Cu, Al or W, or alloys thereof. The trenches may be filled with a conductive material using an electro-plating process, an ELD process or another deposition process such as CVD or ALD.

The conductive material may be formed to overfill the trenches and thus cover the top surface of the dielectric layer 106. Such excess material may subsequently be removed by CMP and/or etch back to form the final conductive paths.

The above method steps may be supplemented with suitable process techniques for via formation, in order to interconnect conducting paths of different metallization levels.

Figure 2A:
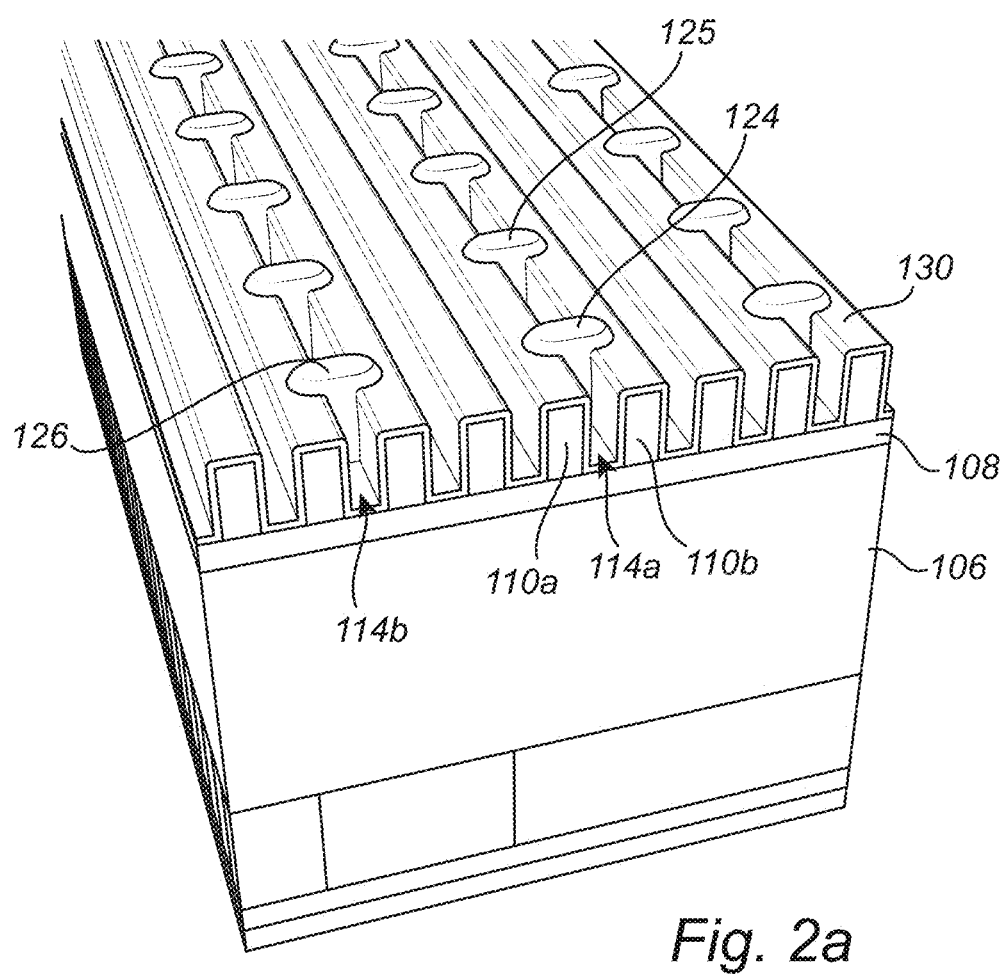
FIGS. 2a, 2b schematically illustrate additional process steps of the method according to embodiments.
Figure 2B:
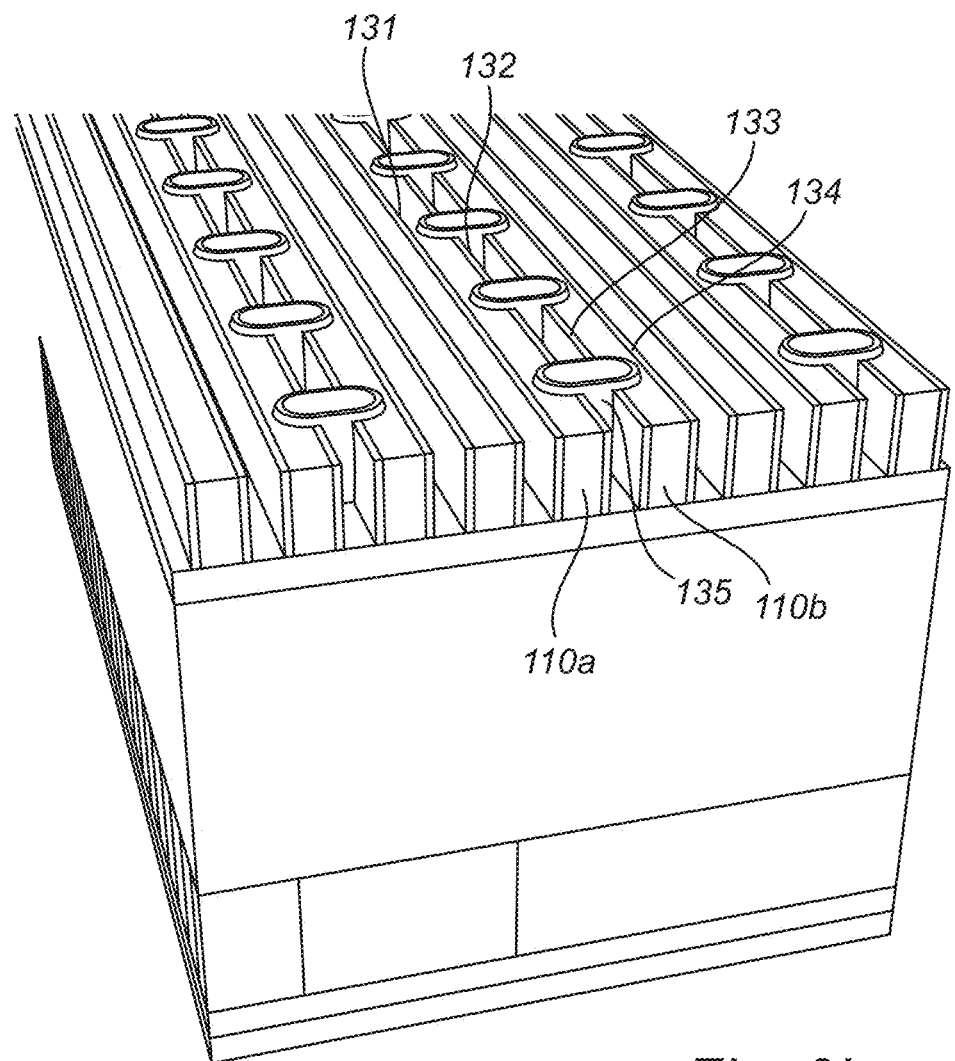

FIGS. 2a and 2b schematically illustrate optional additional process steps which may be incorporated in the method flow.

Subsequent to removing the sacrificial material 116 and prior to transferring a pattern into the mask layer 108 (i.e. at the stage illustrated in FIG. 1g), a conformal layer 130 may be formed to cover the mask layer 108, the material lines 110 and the block masks 124, 125, 126. The conformal layer 130 forms a thin film covering the mask layer 108 in the gaps 114, the sidewalls and top surfaces of the material lines 110 and sidewalls and top surfaces of the block masks 124, 125, 126. The conformal layer 130 may be formed by depositing an oxide in an ALD process. The conformal layer 130 may alternatively be formed by an ALD nitride.

With reference to FIG. 2b, the conformal layer 130 may be etched anisotropically, in the vertical direction, such that the mask layer 108 is exposed in the gaps 114 while conformal layer portions remain on the sidewalls of the material lines 110 and on the block masks 124, 125, 125. As shown in FIG. 2b, the sidewalls of the material line 110a are provided with conformal layer portions 131, 132. The sidewalls of the material line 110b are provided with conformal layer portions 133, 134. The sidewalls of the block mask 124 is provided with conformal layer portion 135. The conformal layer portions 131, 132, 133, 134 form sidewall spacer-like features on the material lines 110 and allow a gap width to be reduced, or restored in case earlier processing steps have caused material loss from the material lines 110.

Subsequent to the anisotropic etch, the method may proceed as discussed in connection with FIG. 1h.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of patterning a target layer, the method comprising:
   forming on the target layer a plurality of parallel lines extending in a first direction, wherein adjacent ones of the lines are spaced apart in a second direction by a gap that exposes the target layer;
   filling the gap with a sacrificial material;
   forming a hole vertically through the sacrificial material in the gap and extending laterally across the gap in the second direction, thereby exposing one or more surface portions including a surface portion of the target layer and surface portions of opposing sidewalls of the adjacent ones of the lines;
   selectively depositing a fill material on the one or more surface portions inside the hole, thereby forming a block mask extending across the gap;
   removing, selectively against the lines and the block mask, the sacrificial material to expose surface of the gap, the gap being interrupted in the first direction by the block mask; and
   transferring a pattern including the lines and the block mask to the target layer.

2. The method according to claim 1, further comprising, prior to selectively depositing the fill material, treating to functionalize one or more surface portions inside the hole and/or to passivate exposed surface portions of the sacrificial material.

3. The method according to claim 2, wherein treating includes etching.

4. The method according to claim 3, wherein the sacrificial material comprises an oxide and one or both of the lines and the target layer comprise a non-oxide material, and wherein treating includes etching the oxide.

5. The method according to claim 3, wherein treating includes wet etching with a hydrofluoric acid (HF)-based etchant.

6. The method according to claim 2, wherein treating is adapted to increase a hydrophilicity of the one or more of surface portions inside the hole and/or to increase the hydrophobicity of exposed surface portions of the sacrificial material.

7. The method according to claim 2, wherein the sacrificial material is an organic material, and wherein treating includes treating with an etchant comprising molecular hydrogen ($H_2$).

8. The method according to claim 1, wherein the fill material is a metal or a dielectric.

9. The method according to claim 1, wherein selectively depositing includes depositing the fill material using an atomic layer deposition process.

10. The method according to claim 1, wherein the fill material is a metal and selectively depositing includes depositing the fill material using an electro-less deposition process.

11. The method according to claim 1, wherein the fill material is a metal, and wherein selectively depositing includes depositing a metal seed layer on the one or more surface portions inside the hole using an atomic layer deposition process and subsequently filling the hole with the fill material using an electro-less deposition process.

12. The method according to claim 1, wherein filling the gap with the sacrificial material includes filling the gap and covering the lines.

13. The method according to claim 12, wherein the sacrificial material includes an upper thickness portion arranged above the lines and a lower thickness portion arranged within the gap, wherein the hole includes an upper hole portion extending through the upper thickness portion and a lower hole portion extending through the lower thickness portion.

14. The method according to claim 1, further comprising forming at least a second hole vertically through the sacrificial material in a second gap and extending laterally across the second gap in the second direction and exposing one or more second surface portions including a second surface portion of the target layer and second surface portions of opposing sidewalls of second adjacent ones of the lines,
wherein selectively depositing the fill material includes selectively growing on the one or more second surface portions inside the second hole, thereby forming a second block mask extending across the second gap.

15. The method according to claim 1, further comprising, subsequent to removing the sacrificial material and prior to transferring the pattern to the target layer:
forming a conformal layer covering the target layer, the lines and the block mask, and
etching the conformal layer anisotropically such that the target layer is exposed in the gaps and portions of the conformal layer remain on sidewalls of the lines and the block mask.

16. A method of patterning, comprising:
providing a substrate having formed thereon a blanket target layer to be patterned;
forming a plurality of lines formed of a first material extending in a first direction, wherein adjacent ones of the lines are laterally separated in a second direction by a gap;
filling the gap with a second material;
forming an etch mask on the second material, the etch mask having an opening having a width wider than a width of the gap, wherein the opening laterally encompasses the gap in the second direction;
using the etch mask to form a hole through the second material in the gap such that a width of the hole in the second direction is limited by the width of the gap;
filling the hole with a third material to form a bridging structure contacting the adjacent ones of the lines; and
removing the second material selectively against the third material and the first material such that a pattern comprising the lines bridged by the bridging structure is formed.

17. The method of claim 16, wherein filling the hole comprises selectively depositing the third material on one or more exposed surfaces of the target layer, the lines and the second material.

18. The method of claim 16, further comprising using the pattern as an etch mask to pattern the blanket target layer.

19. The method of of claim 16, wherein the width of the opening of the etch mask is smaller than a combined width of the adjacent ones of the lines and the gap formed therebetween.

* * * * *

UNITED STATES PATENT AND TRADEMARK OFFICE
CERTIFICATE OF CORRECTION

PATENT NO. : 10,672,655 B2
APPLICATION NO. : 15/975611
DATED : June 2, 2020
INVENTOR(S) : Basoene Briggs Page 1 of 1

It is certified that error appears in the above-identified patent and that said Letters Patent is hereby corrected as shown below:

In the Specification

In Column 3, Line 40, delete "hole," and insert --hole.--.

In Column 6, Line 21, delete "$ZrOx_x$." and insert --$ZrO_x$.--.

In Column 10, Line 47, delete "(e.g," and insert --(e.g.,--.

In Column 10, Line 47, delete "phororesist" and insert --photoresist--.

In Column 12, Line 63, delete "H2/N2" and insert --$H_2/N_2$--.

In Column 13, Line 5, delete "SiO2)," and insert --$SiO_2$),--.

In Column 13, Line 25-26, delete "[0091] With reference" and insert --With reference-- in the same Column 13, Line 27 as the continuation of next paragraph.

In Column 14, Line 4, delete "Ru—–Cu—," and insert --Ru—, Cu—,--.

In the Claims

In Column 18, Line 28, Claim 19, delete "of of" and insert --of--.

Signed and Sealed this
Twenty-seventh Day of October, 2020

Andrei Iancu
*Director of the United States Patent and Trademark Office*